United States Patent [19]

Taniguchi et al.

[11] Patent Number: 4,492,356
[45] Date of Patent: Jan. 8, 1985

[54] PRECISION PARALLEL TRANSLATION SYSTEM

[75] Inventors: Motoya Taniguchi; Minoru Ikeda; Yoshihiro Komeyama, all of Yokohama, Japan

[73] Assignee: Hitachi, Ltd., Tokyo, Japan

[21] Appl. No.: 436,721

[22] Filed: Oct. 26, 1982

[30] Foreign Application Priority Data

Feb. 26, 1982 [JP] Japan ................... 57-28963

[51] Int. Cl.³ ............................................. A47B 91/00
[52] U.S. Cl. ..................... 248/346; 74/479; 144/144 R; 248/637; 248/645; 248/178; 269/73
[58] Field of Search ............... 248/346, 637, 645, 178, 248/DIG. 13; 74/479; 269/73; 144/144 R, 137

[56] References Cited

U.S. PATENT DOCUMENTS

| | | | |
|---|---|---|---|
| 1,285,628 | 11/1918 | Craley | 248/DIG. 13 |
| 3,525,140 | 8/1970 | Cachon | 248/DIG. 13 |
| 4,213,721 | 7/1980 | Aldridge | 269/73 |
| 4,392,642 | 7/1983 | Chitayat | 269/73 |
| 4,404,741 | 9/1983 | Lebet et al. | 269/73 |
| 4,417,384 | 11/1983 | Wilkinson | 269/73 |

Primary Examiner—William H. Schultz
Assistant Examiner—Ramon O. Ramirez
Attorney, Agent, or Firm—Antonelli, Terry & Wands

[57] ABSTRACT

A precision parallel translation system including a pair of tables or upper and lower tables movable parallel to and in directions perpendicular to each other, and a pair of drive means for rough movement each detachably connected to one of the tables to drive the respective table for movement a relatively long distance. Each table supports drive means for fine movement detachably connected to a base (which is the lower table in the case of the upper table) supporting the respective table. The table is moved a relatively long distance by the drive means for rough movement when rough movement is effected, to effect rough positioning of the table. Then the drive means for fine movement is secured to the base while detaching the drive means for rough movement from the table, to drive the table for fine movement to effect precision positioning of the table.

11 Claims, 5 Drawing Figures

PRECISION PARALLEL TRANSLATION SYSTEM

BACKGROUND OF THE INVENTION

1. Field of the Invention

This invention relates to a precision parallel translation system suitable for use, for example, with an exposing device used in the process of production of integrated circuits for effecting transfer-printing of a pattern formed on a mask on a resist film formed on a wafer, to position the wafer placed on a table with respect to the mask with a high degree of precision.

2. Description of the Prior Art

With advances made in the development of integrated circuits in recent years, circuit patterns printed on the wafers are becoming more and more miniscule, making it necessary to increase the precision with which positioning of the mask and the wafer relative to each other is effected when a circuit pattern is printed by transfer-printing on the wafer. For example, when the circuit pattern has a line width of 1 $\mu$m, a high precision of an allowance of below $\pm 0.1$ $\mu$m is required in positioning the mask and the wafer relative to each other.

Proposals have been made to use a precision parallel translation system in which an X-Y table for fine movement is arranged on an X-Y table for rough movement, for the purpose of effecting high precision positioning.

The X-Y table for rough movement of the aforesaid precision parallel translation system comprises a first X (or Y) table arranged on a base for reciprocating movement by the operation of a screw transmission, and a first Y (or X) table arranged on the first X table serving as a base for reciprocating movement by the operation of a screw transmission. The X-Y table for fine movement comprises a second X (or Y) table supported on a pair of plate springs mounted parallel to each other on the Y table for reciprocating movement in the direction of thickness of the plate springs by energization of an electromagnet positioned against an end face, and a second Y (or X) table supported on a pair of plate springs parallel to the X table for reciprocating movement in the direction of thickness of the plate springs by energization of an electromagnet positioned against an end face.

In effecting precision positioning of a wafer with respect to a mask by using a precision parallel translation system of the aforesaid construction, the wafer is placed on the second Y table and moved by means of the X-Y table for rough movement to a position below the mask to position the former precisely with an allowance of about $\pm$several $\mu$m$\sim$10 $\mu$m with respect to the latter. Thereafter a current flowing to the electromagnet of the X-Y table for fine movement is adjusted to effect precision positioning of the wafer with respect to the mask.

Some disadvantages are associated with the precision parallel translation system of the aforesaid construction. The construction in which the X-Y table for rough movement and the X-Y table for fine movement are piled in a stack increases the height of the system (the elevation of the surface on which the wafer is placed from the level of the base). In addition, the bulk of the system becomes inordinately large as compared with the size of a wafer. The position of the center of gravity of the system as a whole is remote from the drive shaft for the X-Y table for rough movement, so that errors would tend to occur in the translation of the X-Y table and the system would be sensitive to influences exerted from outside, such as vibration. Thus the precision achieved by this system in positioning the wafer with respect to the mask is on the order of $\pm 0.5$ $\mu$m.

SUMMARY OF THE INVENTION

One object of this invention is to provide a precision parallel translation system enabling precise positioning to be achieved with an allowance of below $\pm 0.1$ $\mu$m.

Another object is to provide a precision parallel translation system compact in size which comprises a pair of tables constituting a single X-Y table that can operate for both rough and fine movements.

A still another object is to provide a precision parallel translation system which is insensitive to external influences, such as vibration, and capable of achieving precise positioning without any trouble.

The outstanding characteristics of the invention enabling the aforesaid objects to be accomplished are that guide members and drive means for rough movement are arranged on a base, and connecting means for connecting and disconnecting a table to the drive means and drive means for fine movement detachably mounted on the base are mounted on the table slidably supported on the guide members and a moving member for the drive means, whereby when the table is to be moved in rough movement the drive means for rough movement is connected to the table by the connection means and when the table is to be moved in fine movement the drive means for rough movement and the table are disconnected while the drive means for fine movement is secured to the base to thereby move the table in fine movement.

DESCRIPTION OF THE PREFERRED EMBODIMENT

A preferred embodiment of the invention will now be described by referring to the accompanying drawings.

Figure 1:
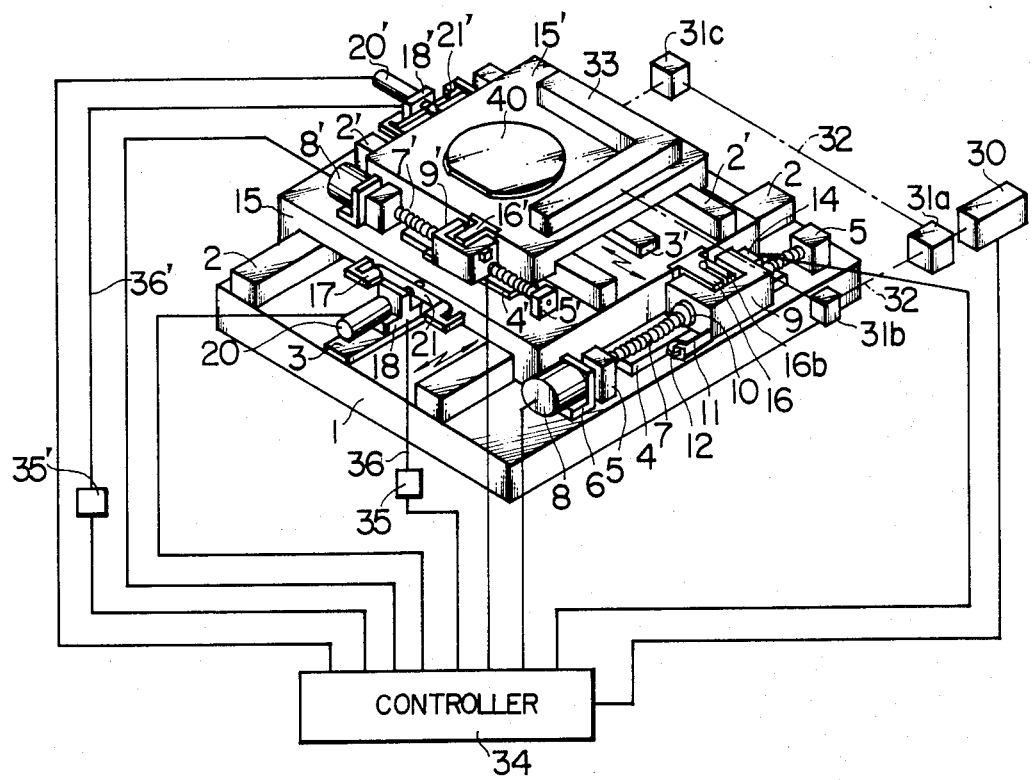
FIG. 1 is a perspective view of the precision parallel translation system comprising one embodiment of the invention.
Figure 2:
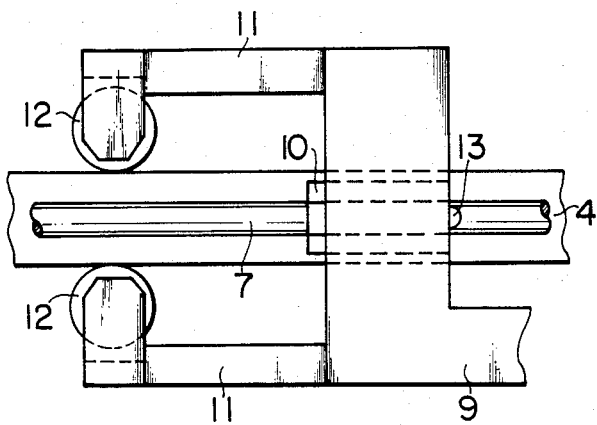
FIG. 2 is a fragmentary view, on an enlarged scale, of the drive means for rough movement shown in FIG. 1.
Figure 3:
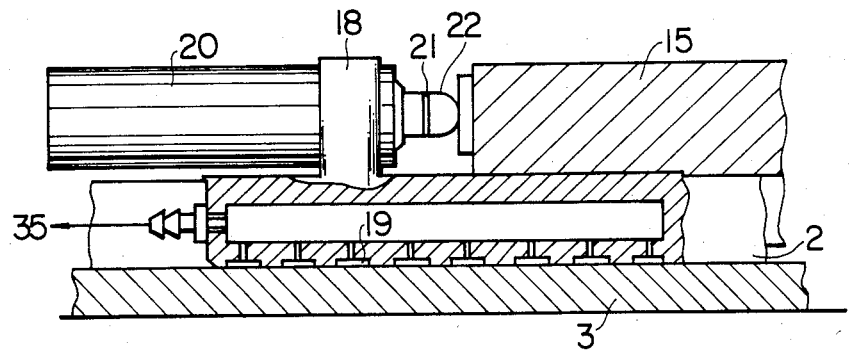
FIG. 3 is a fragmentary view, on an enlarged scale, of the drive means for fine movement shown in FIG. 1.
Figure 4:
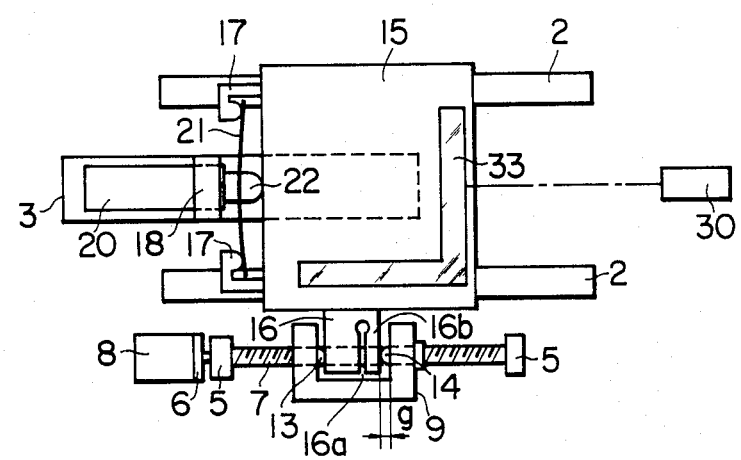
FIGS. 4 and 5 are views in explanation of the operation of the embodiment of the precision parallel translation system in conformity with the invention shown in FIG. 1.
Figure 5:
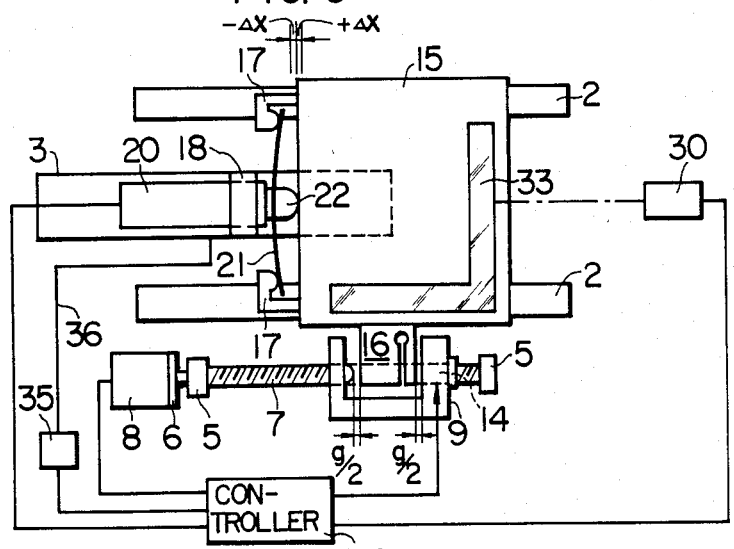

In FIGS. 1–3 showing the preferred embodiment, a base 1 has mounted thereon a pair of rails 2 arranged parallel to each other and spaced a predetermined distance, a plate 3 arranged in the central portion of the spacing between the rails 2, a guide plate 4 located outside the rails in parallel thereto, a pair of bearings 5 located on opposite ends of the guide plate 4, and a bracket 6 located outside one of the bearings 5. The bearings 5 journal a ball screw 7 for rotation. The ball screw 7 is connected to a rotary shaft of a servo-motor 8 supported on the bracket 6, and a block 9 in the form of a letter U has secured thereto a ball nut 10 threadably engaging the ball screw 7. The block 9 supports at its lower end a pair of arms 11 spaced apart a predetermined distance and each supporting a roller 12 for rotation at its forward end. The rollers 12 are arranged in a manner to hold the guide plate 4 therebetween to prevent the block 9 from rotating as the ball screw 7 rotates, to enable the block 9 to move straightforwardly. The servo-motor 8, ball screw 7, ball nut 10 and block 9 constitute drive means for rough movement. A projection 13 (FIG. 2) secured to the block 9 in a position above a groove formed therein extends inwardly of the groove, and a clamp element 14 is arranged on the block 9 in a manner to be juxtaposed against the projection 13. A table 15 slidably supported on the rails 2 has an arm 16 secured to a surface of the table 15 juxtaposed against the block 9 and extending between the projection 13 and the clamp element 14. The arm 16 which is movable through a predetermined gap g in the groove in the block 9 when the clamp element 14 is inoperative is of a size such that it can be held between the projection 13 and the clamp element 14 when the clamp element 14 is operative. The arm 16 is formed with a groove 16a in a position biased toward the clamp element 14 from the central portion thereof, and a tongue 16b of a predetermined resilience located on the side of the clamp element 14 to absorb shock which might otherwise be felt when the clamp element 14 is rendered operative to hold the arm 16 in cooperation with the projection 13. The clamp element 14 and arm 16 constitute connecting means. Thus when the clamp element 14 is operative, the block 9 is connected to the table 15 to provide a unitary structure; when the clamp element 14 is inoperative, the block 9 and table 15 are disconnected to allow the latter to move through the gap g with respect to the former. The table 15 has secured to a lateral surface thereof perpendicular to the direction of its movement a pair of receivers 17 spaced apart a predetermined distance, and the plate 3 has slidably mounted thereon a slide block 18 formed at its surface contacting the plate 3 with apertures 19 for evacuation connected to a vacuum generating source, not shown, through the slide block 18. The slide block 18 supports thereon a fine displacement element 20 having a movable portion mounting a plate spring 21 and a contact member 22 at its forward end. The slide block 18 is connected to the table 15 in such a manner that the contact member 22 is in contact with the lateral surface of the table 15 and the plate spring 21 is in contact with the receivers 17. At this time, the plate spring undergoes elastic deformation to enable intimate contact to be achieved between the contact member 22 and table 15 and between the plate spring 21 and receivers 17. The slide block 18, fine displacement element 20, plate spring 21 and contact member 22 constitute drive means for fine adjustment. If the fine displacement element 20 is actuated by causing the slide block 18 to be attracted to the plate 3 and disconnecting the table 15 and block 9, then the table 15 moves a distance corresponding to the amount of displacement of the fine displacement element 20.

Static pressure air bearings of the linear type or other bearings of the linear type that reduce friction or stick slip when the table 15 moves in sliding movement may be mounted on the rails 2. The clamp element 14 and fine displacement element 20 may be each in the form of an electric strain element (piezoelectric element or PZT) or magnetic strain element. If no satisfactory amount of displacement is obtained by using a single electric strain element, a plurality of electric strain elements may be superposed one over another into a unitary structure.

When the table 15 is an X table moving in an X direction, a Y table moving in a Y direction is supported on the X table serving as a base and constructed identically with the X table. Thus parts of the Y table having the same or similar functions are designated by the same numeral having the mark (') and their detailed description is omitted.

A table 15' has secured to its surface a mirror of the L-shape 33 for reflecting a laser beam emanating from a laser interference measuring instrument 30 and transmitted by an optical system 31a, 31b and 31c.

A controller 34 is connected to the servomotors 8 and 8', clamp elements 14 and 14', fine displacement elements 20 and 20', electromagnetic valves 35 and 35' mounted on pipes 36 and 36' respectively connecting the slide bases 18 and 18' to the vacuum generating source, and laser interference measuring instrument 30. The controller 34 is operative to give instructions to actuate the servo-motors 8 and 8', clamp elements 14 and 14', fine displacement elements 20 and 20' and electromagnetic valves 35 and 35' based on the results achieved by the laser interference measuring instrument 30, to effect positioning of the tables 15 and 15'. The table 15' has a wafer 40 placed on its surface and affixed thereto.

In the precision parallel translation system of the aforesaid construction, positioning of the table 15 is effected in the same manner as positioning of the table 15'. Thus positioning of the table 15 will be described and description of the positioning of the table 15' will be omitted.

First, the position of the table 15' is sensed by the laser interference measuring instrument 30 and the result obtained is applied to the controller 34 which produces a command to actuate the electromagnetic valve 35 to communicate the apertures 19 of the slide block 18 with the atmosphere, to release the plate 3 from connection with the slide block 18. At the same time, a preset voltage (which is one-half the maximum voltage applied at the time of fine movement) is applied to the fine displacement element 20 to bring the fine displacement element 20 to a condition in which it is extended a length one-half the maximum length of extension, and a working voltage is applied to the clamp element 14. As a result, the clamp element 14 is extended into contact with the tongue 16b to press same, to move the table 15 a distance corresponding to the gap between the arm 16 and the projection 13 and hold the arm 16 between the projection 13 and clamp element 14. This connects the block 9 to the table 15. Further extension of the clamp element 14 causes the tongue 16b to undergo elastic deformation to avoid damage that might otherwise be caused on the clamp element 14 and other parts. When the block 9 is connected to the table 15, the servo-motor 8 is actuated based on a command given by the controller 34 to rotate the ball screw 7. This moves the table 15 on the rails 2 through the ball nut 10, block 9 and arm 16. When the table 15 reaches a predetermined stop position, the servo motor 8 is deactuated to bring the table 15 to a halt. At this time, the precision with which the table 15 is brought to a halt corresponds to the precisions of operation of the servo-motor 8, ball screw 7 and ball nut 10. When the table 15 is brought to a halt, the electromagnetic valve 35 is actuated based on a command given by the controller 34 to supply a vacuum pressure to the slide block 18. Evacuation of the apertures 19 of the slide block 18 causes the slide block 18 to be attracted to the plate 3 and affixed thereto. The working voltages applied to the clamp element 14 is removed based on a command given by the controller 34 to cause the clamp element 14 to shrink to form the predetermined gap g between the block 9 and arm 16. Then the servo-motor 8 is reversed by a command given by the controller 34 to move the block 9 backwardly a distance corresponding to one-half the size of the gap g, to thereby form a gap of one-half the size of the gap g on either side of the arm 16. Then the result achieved by the laser interference measuring instrument 30 is applied to the controller 34, which obtains information on the direction and amount of an error in positioning the table 15 to determine a voltage to be impressed on the fine displacement element 20. The voltage being applied to the fine displacement element 20 is replaced by the voltage thus determined, and the fine displacement element 20 either expands or contracts depending on the voltage newly applied thereto. With the slide block 18 being attracted to the plate 3 and secured thereto, the table 15 is pressed by the contact member 22 or pulled by the plate spring 21 as the fine displacement member 20 expands or contracts, so that the table 15 moves a distance $\pm \Delta x$. At this time, it is possible to change the amount of displacement of the fine displacement member 20 on the order of 0.01 $\mu$m by switching the voltage applied thereto with a difference of 1 volt or less. This enables positioning of the table 15 to be effected precisely with an allowance of $\pm 0.1$ $\mu$m or less.

Positioning of the table 15' can be effected in the same manner as described hereinabove by referring to the table 15. Thus positioning of the wafer 40 placed on the table 15' can be effected precisely with a resolving power of below 0.1 $\mu$m.

After effecting rough positioning with an allowance of about $\pm 10$ $\mu$m at high speed over a long distance by the drive means for rough movement, the drive means for fine movement is actuated to effect fine movement to effect positioning precisely with an allowance of below $\pm 0.1$ $\mu$m. Thus the construction of the tables can be simplified. The precise parallel translation system according to the invention can have particular utility with an X-ray exposing device and the like for effecting transfer-printing of the pattern of a mask on a wafer by the process of step and repeat.

In the embodiment shown and described hereinabove, positioning of the tables 15 and 15' has been described as being effected by sensing the position of the mirror 33 placed on the table 15' by means of the laser interference measuring instrument 30. When the system is incorporated in an exposing apparatus, however, the laser interference measuring instrument 30 may be replaced by an aligning means of an exposing device or an aligning means may be used together with the laser interference measuring instrument 30.

What is claimed is:

1. A precision parallel translation system comprising:
a base;
a pair of guide members parallel to each other spaced apart a predetermined distance on said base;
first rough drive means including a first moving member for rough movement arranged on said base in parallel relation to said pair of guide members;
a first table slidably supported on said pair of guide members;
first connecting means supported on said first table for connecting and disconnecting said first moving member of said first rough drive means to said first table;
first fine drive means for fine movement supported on a support member arranged for slidingly moving and fixedly secured relation to said base, said first fine drive means including a movable portion connected to said first table;
a pair of guide members parallel to each other spaced apart a predetermined distance on said first table;
second rough drive means including a second moving member for rough movement arranged on said first table and arranged parallel to said pair of guide members;
a second table slidably supported on said pair of guide members;
second connecting means supported on said second table for connecting and disconnecting said second moving member of said second rough drive means to said second table; and
second fine drive means for fine movement supported on a support member arranged for slidingly moving and fixedly secured relation to said first table, said second fine drive means including a movable portion connected to said second table.

2. A precision parallel translation system as claimed in claim 1, wherein said first and second rough drive means for rough movement each comprise a screw transmission including a ball screw and a ball nut.

3. A precision parallel translation system as claimed in claim 2, wherein said first and second connecting means each comprise an arm extending from the table in a manner to cross the path of movement of said ball nut and located in predetermined spaced juxtaposed relation thereto, and a clamp element supported on said ball nut or said arm and operative to press at its moving end against an end face of said arm or ball nut to thereby connect the ball nut and the arm together.

4. A precision parallel translation system as claimed in claim 3, wherein said clamp element comprises an electric strain element.

5. A precision parallel translation system as claimed in claim 1, wherein said first and second fine drive means for fine movement each comprise a slide block arranged for sliding movement with respect to the base on which said drive means is supported, said slide block being formed with apertures for drawing and attracting said slide block to said base, and a fine displacement element supported on said slide block, said fine displacement element being connected to the table through a resilient member.

6. A precision parallel translation system as claimed in claim 5, wherein said fine displacement element comprises an electric strain element.

7. A precision parallel translation system as claimed in claim 4, wherein said electric strain element is a piezoelectric element.

8. A precision parallel translation system as claimed in claim 3, wherein said clamp element comprises a magnetic strain element.

9. A precision parallel translation system as claimed in claim 6, wherein said electric strain element is a piezoelectric element.

10. A precision parallel translation system as claimed in claim 5, wherein said fine displacement element comprises a magnetic strain element.

11. A precision parallel translation system comprising:
a base;

a first pair of guide members parallel to each other spaced apart a predetermined distance on said base;

first rough drive means for rough movement arranged on said base in parallel relation to said first pair of guide members, said first rough drive means being provided with a first moving member moving in a direction parallel to said first pair of guide members;

a first table slidably supported on said first pair of guide members, said first table being provided with a first connecting member associated with said first moving member;

first connecting means support by one of said first moving member and said first connecting member for connecting and disconnecting said first moving member to said first connecting member;

first fine drive means for fine movement supported on a support member arranged for slidingly moving and fixedly secured relation to said base, said first fine drive means including a movable portion connected to said first table;

a second pair of guide members parallel to each other spaced apart a predetermined distance on said first table, said second pair of guide members being located perpendicular to said first pair of guide members;

second rough drive means for rough movement arranged on said first table and located parallel to said second pair of guide members, said second rough drive means being provided with a second moving member moving in a direction parallel to said second pair of guide members;

a second table slidably supported on said pair of second guide members, said second table being provided with a second connecting member associated with said second moving member;

second connecting means supported by one of said second moving member and said second connecting member for connecting and disconnnecting said second moving member to said second connecting member; and second fine drive means for fine movement supported on a support member arranged for slidingly moving and fixedly secured relation to said first table, said second fine drive means including a movable portion connected to said second table.

* * * * *